(12) United States Patent
Mellitz et al.

(10) Patent No.: US 7,459,985 B2
(45) Date of Patent: Dec. 2, 2008

(54) CONNECTOR HAVING A CUT-OUT FOR REDUCED CROSSTALK BETWEEN DIFFERENTIAL CONDUCTORS

(75) Inventors: Richard Mellitz, Irmo, SC (US); John J. Abbott, Columbia, SC (US); Gopal R. Mundada, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 11/321,892

(22) Filed: Dec. 29, 2005

(65) Prior Publication Data

US 2007/0152768 A1 Jul. 5, 2007

(51) Int. Cl.
*H01P 3/02* (2006.01)
*H01P 1/04* (2006.01)

(52) U.S. Cl. .......................... 333/5; 333/260
(58) Field of Classification Search .................. 333/1, 333/4, 5, 246, 260
See application file for complete search history.

(56) References Cited

U.S. PATENT DOCUMENTS

| | | | | |
|---|---|---|---|---|
| 4,891,616 A | * | 1/1990 | Renken et al. | 333/236 |
| 6,501,352 B1 | * | 12/2002 | Koriyama et al. | 333/260 |
| 2003/0034854 A1 | * | 2/2003 | Tzeng | 333/5 |
| 2003/0180011 A1 | * | 9/2003 | Aronson | 385/92 |

* cited by examiner

*Primary Examiner*—Benny Lee
(74) *Attorney, Agent, or Firm*—Robert D. Anderson (57) ABSTRACT

In some embodiments, an circuit card includes an electronic circuit substrate, a ground plane on the electronic circuit substrate, first and second differential signal pads on the electronic circuit substrate, a ground return signal pad associated with the first and second differential signal pads, the ground return signal pad being connected to the ground plane on the electronic substrate, and a cutout structure on the ground plane positioned near a location where the ground return signal pad connects to the ground plane, wherein the cutout structure is configured to direct a ground return path associated with the first and second differential signal pads to the ground return signal pad associated with the first and second differential signal pads. Other embodiments are disclosed and claimed.

17 Claims, 8 Drawing Sheets

CONNECTOR HAVING A CUT-OUT FOR REDUCED CROSSTALK BETWEEN DIFFERENTIAL CONDUCTORS

The invention relates to connectors and systems utilizing connectors. More particularly, some embodiments of the invention relate to a connector with reduced crosstalk. Some embodiments of the invention relate to an edge connector configured to reduce connector crosstalk by channeling return paths.

BACKGROUND AND RELATED ART

Add-in cards having edge connectors are commonly used in computers and other electronic systems. A high speed bus generally requires a high-performance connector interface. One aspect that impacts the connector high frequency electrical performance may be the connector-to-add-in-card interface design. For example, PCI Express cards utilize an edge connector. As the PCI Express standard migrates to future generations with a higher data rate, further improvement in connector electrical performance may be beneficial.

BRIEF DESCRIPTION OF THE DRAWINGS

Various features of the invention will be apparent from the following description of preferred embodiments as illustrated in the accompanying drawings, in which like reference numerals generally refer to the same parts throughout the drawings. The drawings are not necessarily to scale, the emphasis instead being placed upon illustrating the principles of the invention.

DETAILED DESCRIPTION

In the following description, for purposes of explanation and not limitation, specific details are set forth such as particular structures, architectures, interfaces, techniques, etc. in order to provide a thorough understanding of the various aspects of the invention. However, it will be apparent to those skilled in the art having the benefit of the present disclosure that the various aspects of the invention may be practiced in other examples that depart from these specific details. In certain instances, descriptions of well known devices, circuits, and methods are omitted so as not to obscure the description of the present invention with unnecessary detail.

Figure 1:
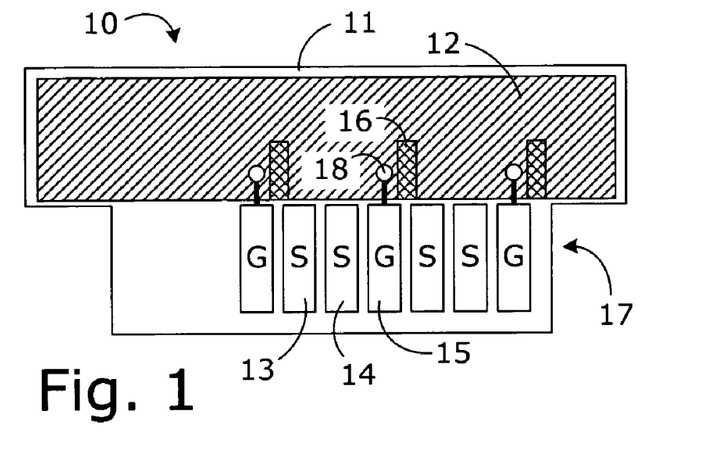
FIG. 1 is a block representation of a circuit card in accordance with some embodiments of the invention.

With reference to FIG. 1, an electronic circuit card 10 may include an electronic circuit substrate 11 and a ground plane 12 on the electronic circuit substrate 11. The card 10 may include first and second differential signal (hereinafter designated by "S") pads 13 and 14 on the electronic circuit substrate 11 and a ground return signal (hereinafter designated by "G") pad 15 associated with the first and second differential signal pads 13, 14. The ground return signal pad 15 may be connected to the ground plane 12 on the electronic substrate 11. The card 10 may include a cutout structure 16 on the ground plane 12 positioned near a location where the ground return signal pad 15 connects to the ground plane 12. For example, the cutout structure 16 may be configured to direct a ground return path associated with the first and second differential signal pads 13, 14 to the ground return signal pad 15 associated with the first and second differential signal pads 13, 14. For example, the circuit card 10 may be a multi-layer printed circuit board configured, for example, as an add-in card.

In some embodiments, the cutout structure 16 may have a shape selected to reduce crosstalk in a frequency of interest. For example, the cutout structure 16 may have an elongated shape having a length selected to be shorter than one quarter wavelength of a highest relevant frequency signal anticipated to be present on the first and second differential signal pads 13, 14. For example, the cutout structure 16 may be considered to be a void, a slot, a trench, or a moat in the ground plane 12. For example, the highest relevant frequency signal anticipated may correspond to a nominal maximum switching frequency for the differential signal pair, a nominal maximum clock rate of a bus, or another specified maximum system frequency, among other things.

In some embodiments, the first and second differential signal pads 13, 14 may be adjacent fingers 13, 14 of an edge connector 17 and the ground return signal pad 15 may be another finger 15 of the edge connector 17 adjacent to the first and second differential signal fingers 13, 14. For example, the ground plane 12 may be an internal ground plane 12. The ground return signal finger 15 may be connected to the internal ground plane 12 by a via 18. In some embodiments, the cutout structure 16 may include an elongated slot 16 on the internal ground plane 12 positioned next to the via 18 and extending from an edge of the ground plane 12 inwardly beyond the via 18. For example, a length of the elongated slot 16 may be shorter than one quarter wavelength of a highest relevant frequency signal anticipated to be present on the first and second differential signal fingers 13, 14.

Figure 2:
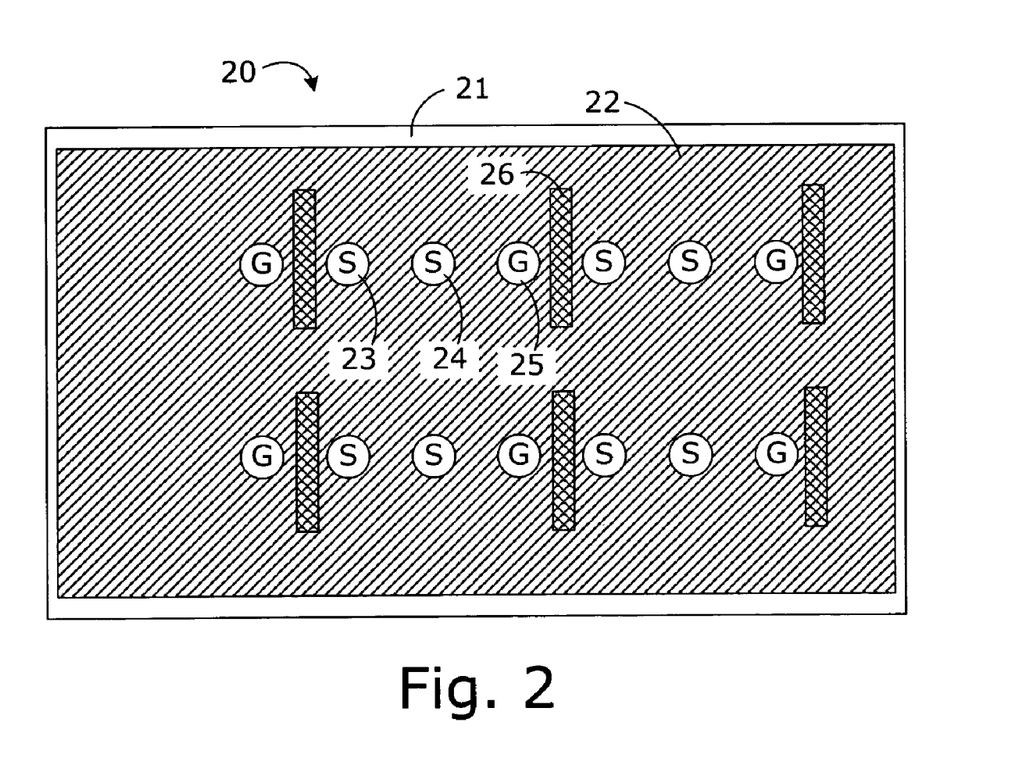
FIG. 2 is a block representation of another circuit card in accordance with some embodiments of the invention.

With reference to FIG. 2, an electronic circuit card 20 may include an electronic circuit substrate 21 and a ground plane 22 on the electronic circuit substrate 21. The card 20 may include first and second differential signal pads 23 and 24 on the electronic circuit substrate 21 and a ground return signal pad 25 associated with the first and second differential signal pads 23, 24. The ground return signal pad 25 may be connected to the ground plane 22 on the electronic substrate 21. The card 20 may include a cutout structure 26 on the ground plane 22 positioned near a location where the ground return signal pad 25 connects to the ground plane 22. For example, the cutout structure 26 may be configured to direct a ground return path associated with the first and second differential signal pads 23, 24 to the ground return signal pad 25 associated with the first and second differential signal pads 23, 24. For example, the circuit card 20 may be a multi-layer printed circuit board configured, for example, as a system board or motherboard.

In some embodiments, the cutout structure 26 may have a shape selected to reduce crosstalk in a frequency of interest. For example, the cutout structure 26 may have an elongated shape having a length selected to be shorter than one quarter wavelength of a highest relevant frequency signal anticipated to be present on the first and second differential signal pads 23, 24. For example, the ground plane 22 may be an internal ground plane 22 and the ground return signal pad 25 may be connected to the internal ground plane 22 by a plated through hole. For example, the cutout structure 26 may be considered to be a void, a slot, a trench, or a moat in the ground plane 22. For example, the cutout structure 26 may include a rectangular void on the internal ground plane 22 positioned next to the plated through hole and extending beyond the plated through hole in two directions.

Figure 3:
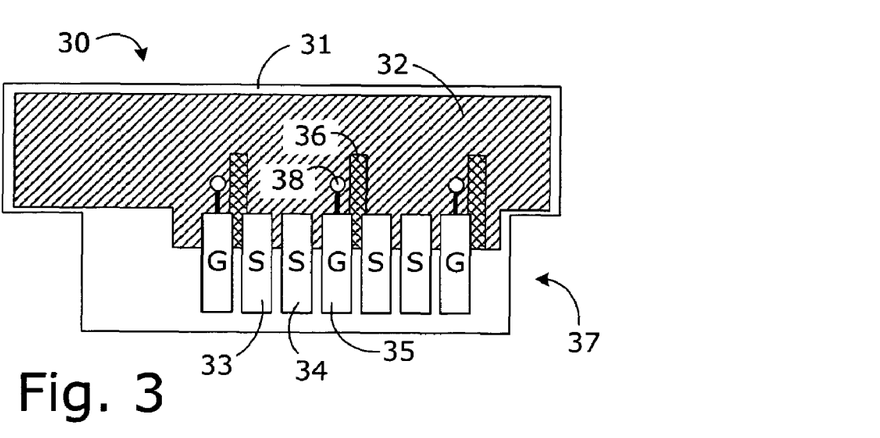
FIG. 3 is a block representation of another circuit card in accordance with some embodiments of the invention.
Figure 4:
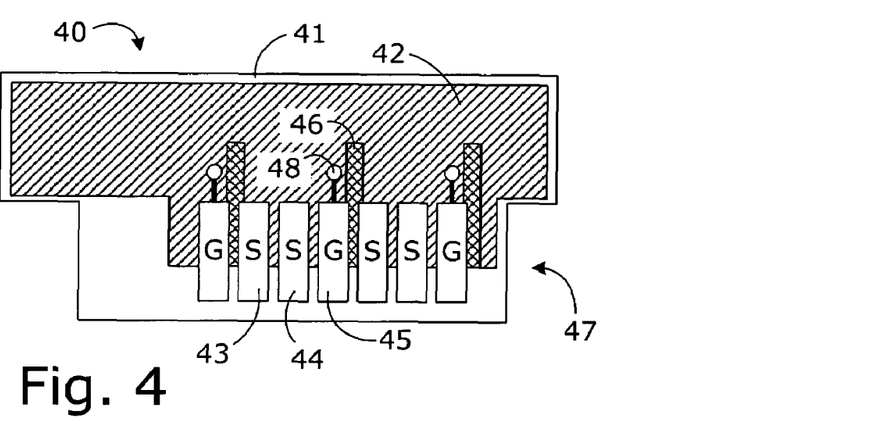
FIG. 4 is a block representation of another circuit card in accordance with some embodiments of the invention.
Figure 5:
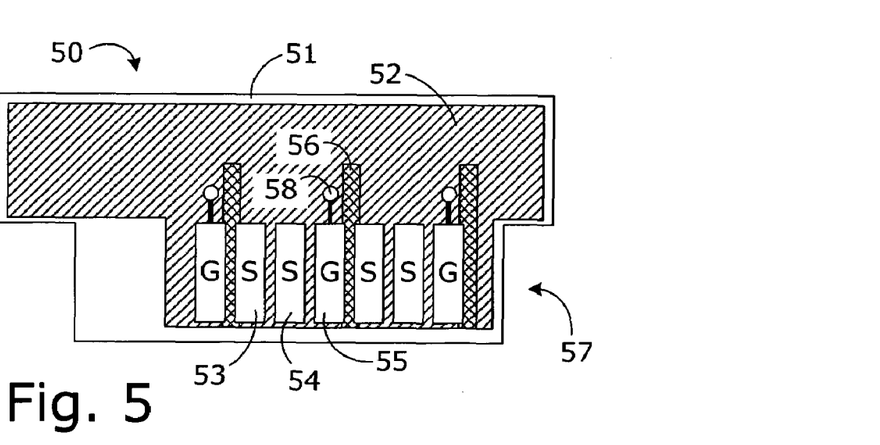
FIG. 5 is a block representation of another circuit card in accordance with some embodiments of the invention.

With reference to FIGS. 3-5, similarly configured electronic circuit cards 30, 40, and 50, respectively associated with FIG. 3, FIG. 4, and FIG. 5, include similarly numbered elements including an electronic circuit substrate 31, 41, 51, respectively associated with FIG. 3, FIG. 4, and FIG. 5, and a ground plane 32, 42, 52, respectively associated with FIG. 3, FIG. 4, and FIG. 5, on the electronic circuit substrate 31, 41, 51, respectively associated with FIG. 3, FIG. 4, and FIG. 5, The cards 30, 40, 50, respectively associated with FIG. 3, FIG. 4, and FIG. 5, may include first and second differential signal pads 33, 43, 53, respectively associated with FIG. 3, FIG. 4, and FIG. 5, and 34, 44, 54, respectively associated with FIG. 3, FIG. 4, and FIG. 5, on the electronic circuit substrate 31, 41, 51, respectively associated with FIG. 3, FIG. 4, and FIG. 5, and a ground return signal pad 35, 45, 55, respectively associated with FIG. 3, FIG. 4, and FIG. 5, associated with the first and second differential signal pads. The ground return signal pad may be connected to the ground plane on the electronic substrate. The cards may include a cutout structure 36, 46, and 56, respectively associated with FIG. 3, FIG. 4, and FIG. 5, on the ground plane positioned near a location where the ground return signal pad connects to the ground plane. For example, the cutout structure may be configured to direct a ground return path associated with the first and second differential signal pads to the ground return signal pad associated with the first and second differential signal pads. For example, the circuit cards may be multi-layer printed circuit boards configured, for example, as add-in cards.

In some embodiments, the cutout structure may have a shape selected to reduce crosstalk in a frequency of interest. For example, the cutout structure may have an elongated shape having a length selected to be shorter than one quarter wavelength of a highest relevant frequency signal anticipated to be present on the first and second differential signal pads.

In some embodiments, the first and second differential signal pads may be adjacent fingers of an edge connector 37, 47, 57, respectively associated with FIG. 3, FIG. 4, and FIG. 5, and the ground return signal pad may be another finger of the edge connector adjacent to the first and second differential signal fingers. For example, the ground plane may be an internal ground plane. The ground return signal finger may be connected to the internal ground plane by a via 38, 48, 58, respectively associated with FIG. 3, FIG. 4, and FIG. 5, In some embodiments, the cutout structure may include an elongated slot on the internal ground plane positioned next to the via and extending from an edge of the ground plane inwardly beyond the via. For example, a length of the elongated slot may be shorter than one quarter wavelength of a highest relevant frequency signal anticipated to be present on the first and second differential signal fingers.

In each of FIGS. 3-5, the ground plane 32, 42, 52 may include an internal ground plane which extends under the fingers of the edge connector. In FIG. 3, the internal ground plane 32 may extend significantly under the fingers of the edge connector 37 (e.g. at least 20% or more). In FIG. 4, the internal ground plane 42 extends substantially under the fingers of the edge connector 47 (e.g. at least 50% or more). In FIG. 5, the internal ground plane 52 extends substantially completely under the fingers of the edge connector (e.g. at least 90% or more).

Figure 6:
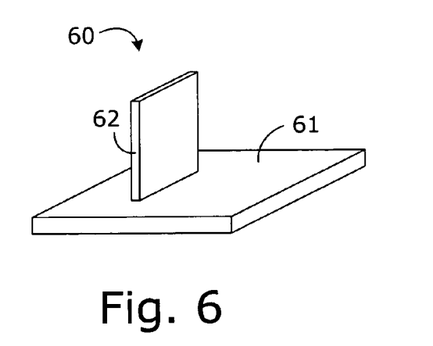
FIG. 6 is a perspective view of an electronic system in accordance with some embodiments of the invention.

With reference to FIG. 6, a system 60 includes a system card 61 (e.g. a motherboard) and a riser card 62 (e.g. a PCI express graphics card). For example, the riser card 62 may include circuits that produce high frequency signals which are susceptible to crosstalk. Advantageously, in some embodiments of the invention the riser card 62 and/or system card 61 may be configured to reduce crosstalk by channeling ground return paths. For example, channeling ground return paths in accordance with some embodiments of the invention may be beneficial for systems utilizing PCI Express, fully buffered DIMM (FBD), and/or common system interface (CSI) by enabling low cost, high pin density connector alternatives.

Figure 7:
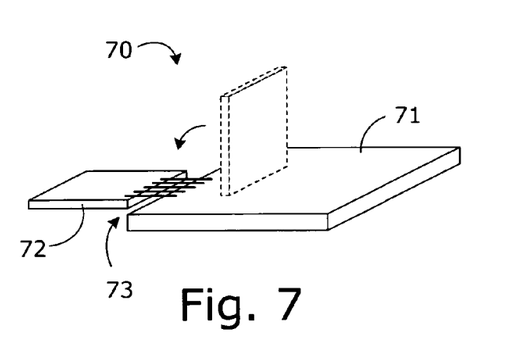
FIG. 7 is a perspective view illustrating a simulation model in accordance with some embodiments of the invention.

With reference to FIGS. 7-12, and without being limited to theory of operation, a simulation may be helpful to understanding principles and potential benefits of some embodiments of the invention. In FIG. 7, a simulation system 70 includes a simplified model including a first card 71 (e.g. a system card or motherboard) and a second card 72 (e.g. a riser card or add-in card) with a simulated connector interface 73 between the two cards. To simplify the simulation model, the second card is modeled on the same plane as the first card (e.g. with the riser card rotated 90 degrees from its typical perpendicular orientation).

Figure 8:
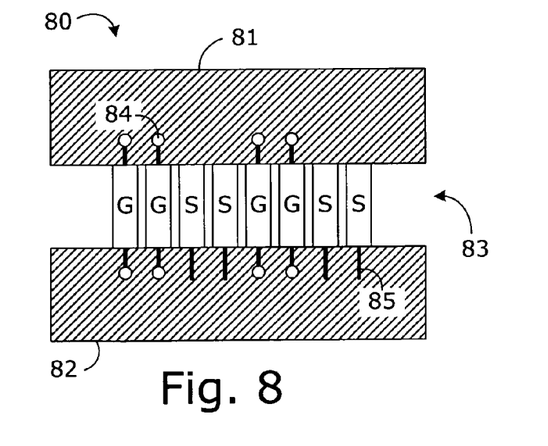
FIG. 8 is a block representation of a simulation model of a related connector interface.

With reference to FIG. 8, a simulation model 80 may include a first simulated card 81, a second simulated card 82, and a connector interface 83 between the two cards having two ground pins (G) for each pair of differential signal pins (S). For example, the ground and signal pins may be simulated as fingers of an edge connector arranged in a repeating pattern of GGSSGGSS.

The simulation model 80 may be configured as a multi-layer printed circuit board having alternating layers of FR4 dielectric material and copper conductive material. For example, each layer of FR4 material may be simulated as at least about 8 mils thick and the copper conductive material may be simulated as 1.3 mils thick. A simulated six layer printed circuit board may include six conductive layers including two conductive external layers, two conductive internal signal layers, and two internal conductive power plane layers (e.g. including an internal ground plane). Each of the fingers may be simulated as having dimensions of 100 mils by 39 mils (and 1.3 mils thick) with a spacing of 28 mils between the fingers. The ground fingers (G) are simulated to be connected to the internal ground plane by a via 84. The signals fingers (S) are simulated to be connected to signals lines 85 having dimensions of 5 mils wide by 100 mils long (and 1.3 mils thick). For purposes of the simulation, the spacing between the first and second cards may be 90 mils, such that the fingers overlap the simulated edge of the cards by about 10 mils.

Figure 9:
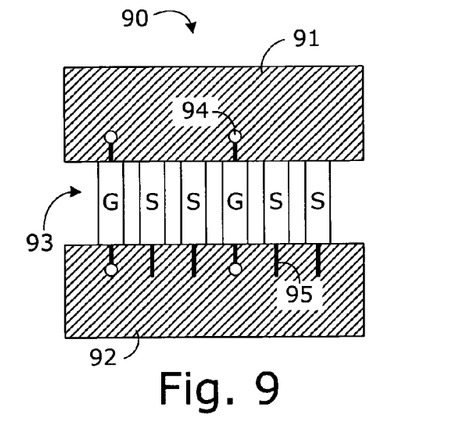
FIG. 9 is a block representation of a simulation model of another related connector interface.

With reference to FIG. 9, a simulation model 90 may include a first simulated card 91, a second simulated card 92, and a connector interface 93 between the two cards having one ground pin (G) for each pair of differential signal pins (S). For example, the ground and signal pins may be simulated as fingers of an edge connector arranged in a repeating pattern of GSSGSS. The model 90 may otherwise be similarly configured to the model 80, including vias 94 connecting the ground pins (G) to an internal ground plane of a six layer printed circuit board, and simulated signal lines 95 connected to the signal pins (S).

Figure 10:
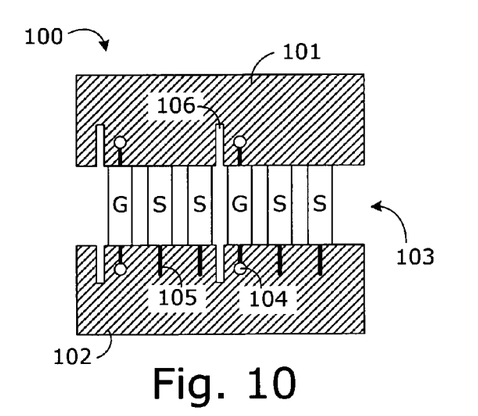
FIG. 10 is a block representation of a simulation model of a connector interface in accordance with some embodiments of the invention.

With reference to FIG. 10, a simulation model 100 according to some embodiments of the invention may include a first simulated card 101, a second simulated card 102, and a connector interface 103 between the two cards having one ground pin (G) for each pair of differential signal pins (S). For example, the ground and signal pins may be simulated as fingers of an edge connector arranged in a repeating pattern of GSSGSS. The model 100 may otherwise be similarly configured to the model 80, including vias 104 connecting the ground pins (G) to an internal ground plane of a six layer printed circuit board, and simulated signal lines 105 connected to the signal pins (S). The model 100 further includes slots 106 positioned next to the vias 104. Without being limited to theory of operation, the slots 106 may be configured to channel return paths for the respective associated differential signal pairs. In the simulation model 100, the slots are 5 mils wide by 200 mils long.

Figure 11:
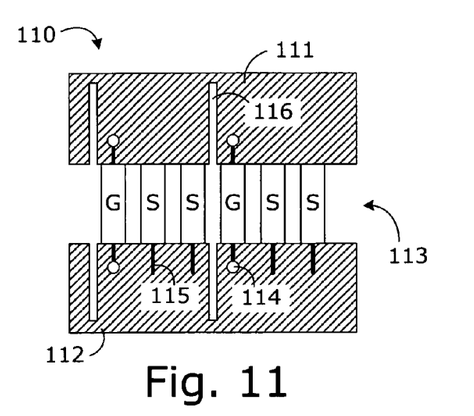
FIG. 11 is a block representation of a simulation model of another connector interface in accordance with some embodiments of the invention.

With reference to FIG. 11, a simulation model 110 according to some embodiments of the invention may include a first simulated card 111, a second simulated card 112, and a connector interface 113 between the two cards having one ground pin (G) for each pair of differential signal pins (S). For example, the ground and signal pins may be simulated as fingers of an edge connector arranged in a repeating pattern of GSSGSS. The model 110 may otherwise be similarly configured to the model 80, including vias 114 connecting the ground pins (G) to an internal ground plane of a six layer printed circuit board, and simulated signal lines 115 connected to the signal pins (S). The model 110 further includes slots 116 positioned next to the vias 114. Without being limited to theory of operation, the slots 116 may be configured to channel return paths for the respective associated differential signal pairs. In the simulation model 110, the slots are 5 mils wide by 400 mils long.

Figure 12:
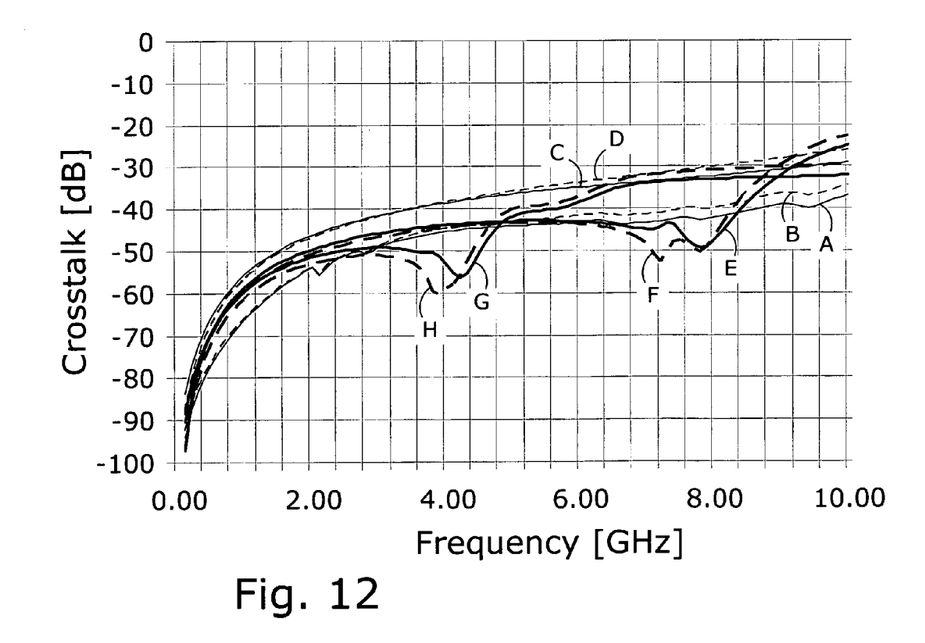
FIG. 12 is a comparison graph of crosstalk versus frequency showing results of a simulation of the connector interfaces from FIGS. 8-11.

With reference to FIG. 12, a simulation was performed using the HFSS (High Frequency Structure Simulator) simulator which is commercially available from Ansoft Corporation. The near end crosstalk for the simulation model 80 corresponds to the thin, solid line A and the far end crosstalk for the simulation model 80 corresponds to the thin, dashed line B. The near end crosstalk for the simulation model 90 corresponds to the thin, solid line C and the far end crosstalk for the simulation model 90 corresponds to the thin, dashed line D. The near end crosstalk for the simulation model 100 corresponds to the thick, solid line E and the far end crosstalk for the simulation model 100 corresponds to the thick, dashed line F. The near end crosstalk for the simulation model 110 corresponds to the thick, solid line G and the far end crosstalk for the simulation model 110 corresponds to the thick, dashed line H.

As can be seen from FIG. 12, the GGSSGGSS pin-out for the model 80 (See FIG. 8) demonstrates better crosstalk performance (e.g. reduced crosstalk) as compared to the GSSGSS pin-out for the model 90 (See FIG. 9). However, the GSSGSS pin-out provides higher pin density because the extra ground pin is omitted. Advantageously, over selected frequency ranges, the models 100 and 110 in accordance with some embodiments of the invention demonstrate better crosstalk performance than the models 80 and/or 90. Advantageously, the models 100 and 110 may provide the benefit of both high pin density and reduced crosstalk.

The reference model 80, for example, may correspond to a PCI express connector which is a relatively low cost connector. For example, various riser cards for PCI express, FBD, and/or CSI typically may require a similar connector to this reference connector. However, in more demanding applications (e.g. multiple FBD channels, CSI and/or PCI express links on a riser) the PCI express style pin-out may not be able to be utilized because the connector may become physically too long and will not fit in the required form factor (e.g. due to the lower pin density). To meet the form factor requirements, a server style connector having higher pin density may be utilized (and otherwise meeting the signal integrity/crosstalk requirements). However, these higher pin density connectors are relatively expensive connector. For example, a commercially available connector with two FBD channels may cost an order of magnitude more per riser card than the PCI express connector (e.g. about $15 US versus about $1 US). In a typical 4-socket configuration 4 or 8 risers might be used. So the total cost may be about $60 to $120. In addition to cost savings, some embodiments of the invention may provide lower signal to ground ratio than high density server style connectors.

Conventional thinking is that proximal field coupling is primarily involved in causing crosstalk and that the extra ground pin (e.g. in the GGSS pin-out) reduces crosstalk by reducing proximal field coupling. Without being limited to theory of operation, in some embodiments of the present invention channeling return paths may eliminate or reduce the sharing of adjacent return paths, and thereby reduce crosstalk. For example, by directing return currents with a ground moat (e.g. as shown in FIGS. 10 and 11), the return path associated with one differential signal pair is directed toward the associated ground pins. Some embodiments of the invention may utilize a slot that forces return currents that cause crosstalk not to mix between proximal lines. For example, some embodiments of the invention may utilize a slot or moat that is shorter than the corresponding quarter wavelength of the highest frequency of concern.

The crosstalk performance may be dependant on the length of the moat, and advantageously may be tuned in accordance with a frequency of interest. The results for the reference model 80 (GGSS pin-out) are comparable with the model 100 (GSSG pin-out, 200 mil trench) for frequencies below the equivalent quarter wavelength of the moat. For example, the model 110 with the 400 mil trench has a resonance at about 4 GHz and the model 100 with the 200 mil trench has resonance of about 8 GHz.

Figure 13:
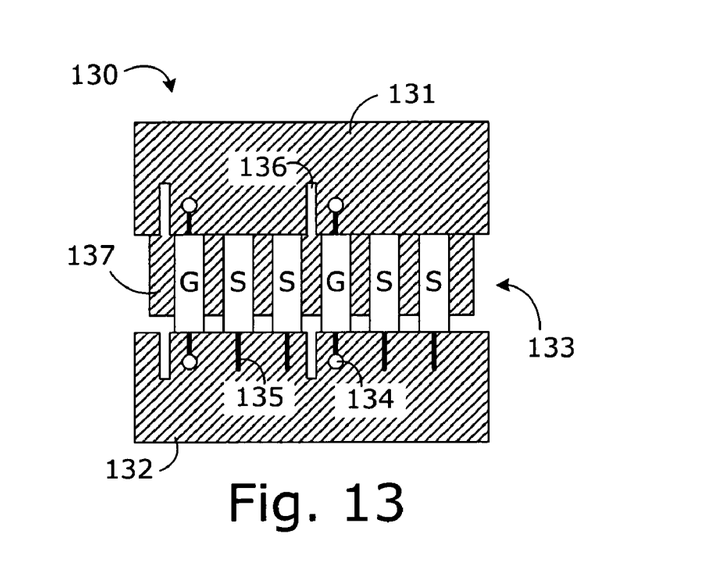
FIG. 13 is a block representation of a simulation model of another connector interface in accordance with some embodiments of the invention.
Figure 14:
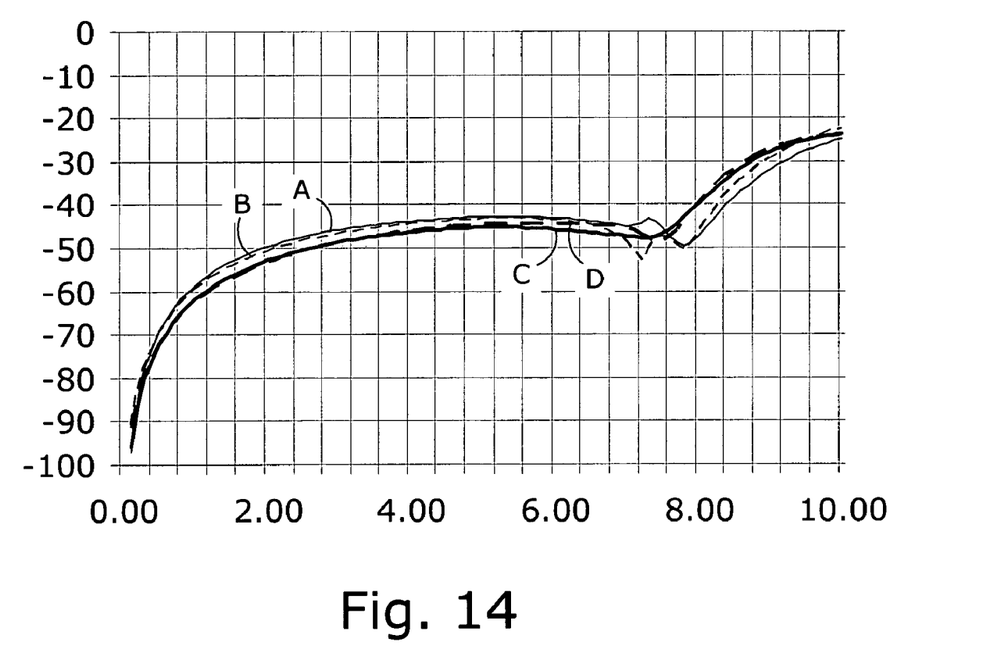
FIG. 14 is a comparison graph of crosstalk versus frequency showing results of a simulation of the connector interfaces from FIGS. 10 and 13.

With reference to FIGS. 13-14, some embodiments of the invention may involve removing portions of only the top and bottom ground planes to improve the impedance discontinuity from the edge card finger. Prior PCI guidelines suggest removing all the ground/power planes directly under the fingers. However, in some embodiments, leaving the middle ground/power planes intact may reduce the crosstalk from each side of the board.

In FIG. 13, a simulation model 130 according to some embodiments of the invention may include a first simulated card 131, a second simulated card 132, and a connector interface 133 between the two cards having one ground pin (G) for each pair of differential signal pins (S). For example, the ground and signal pins may be simulated as fingers of an edge connector arranged in a repeating pattern of GSSGSS. The model 130 may otherwise be similarly configured to the model 30, including vias 134 connecting the ground pins (G) to an internal ground plane of a six layer printed circuit board, simulated signal lines 135 connected to the signal pins (S), and 200 mil slots 136 positioned next to the vias 134. The model 130 further includes an additional internal power or ground plane 137 which substantially extends under the fingers (e.g. leaving a simulated 20 mil gap between the extended power plane and the edge of the card 132).

With reference to FIG. 14, a simulation was performed using the HFSS simulator which is commercially available from Ansoft Corporation. The near end crosstalk for the simulation model 100 corresponds to the thin, solid line A and the far end crosstalk for the simulation model 100 corresponds to the thin, dashed line B. The near end crosstalk for the simulation model 130 corresponds to the thick, solid line C and the far end crosstalk for the simulation model 130 corresponds to the thick, dashed line D. As can be seen from FIG. 14, the extended power plane for the model 130 demonstrates better crosstalk performance (e.g. reduced crosstalk) as compared to the model 100, over selected frequencies (e.g. below about 8 GHz). Accordingly, in some embodiments of the invention, removing the reference plane directly below edge connector fingers while leaving a middle reference plane may improve crosstalk isolation.

Figure 15:
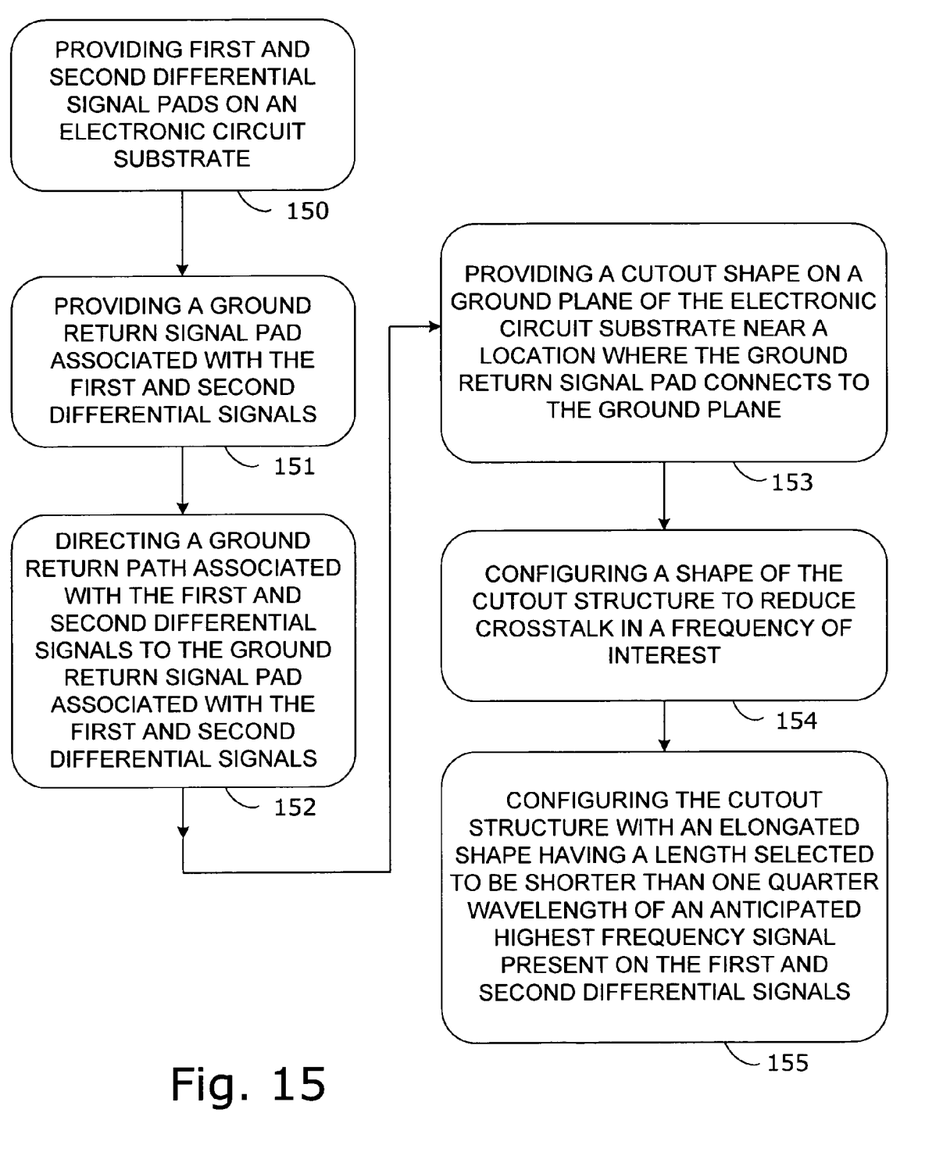
FIG. 15 is a flow diagram illustrating a method in accordance with some embodiments of the invention.

With reference to FIG. 15, some embodiments of the invention may involve providing first and second differential signal pads on an electronic circuit substrate (e.g. at block 150), providing a ground return signal pad associated with the first and second differential signal pads (e.g. at block 151), and directing a ground return path associated with the first and second differential signal pads to the ground return signal pad associated with the first and second differential signal pads (e.g. at block 152).

In some embodiments of the invention, directing the ground return path may involve providing a cutout shape on a ground plane of the electronic circuit substrate near a location where the ground return signal pad connects to the ground plane (e.g. at block 153). Some embodiments may further involve configuring a shape of the cutout structure to reduce crosstalk in a frequency of interest (e.g. at block 154). Some embodiments may further involve configuring the cutout structure with an elongated shape having a length selected to be shorter than one quarter wavelength of a highest relevant frequency signal anticipated to be present on the first and second differential signal pads (e.g. at block 155).

Figure 16:
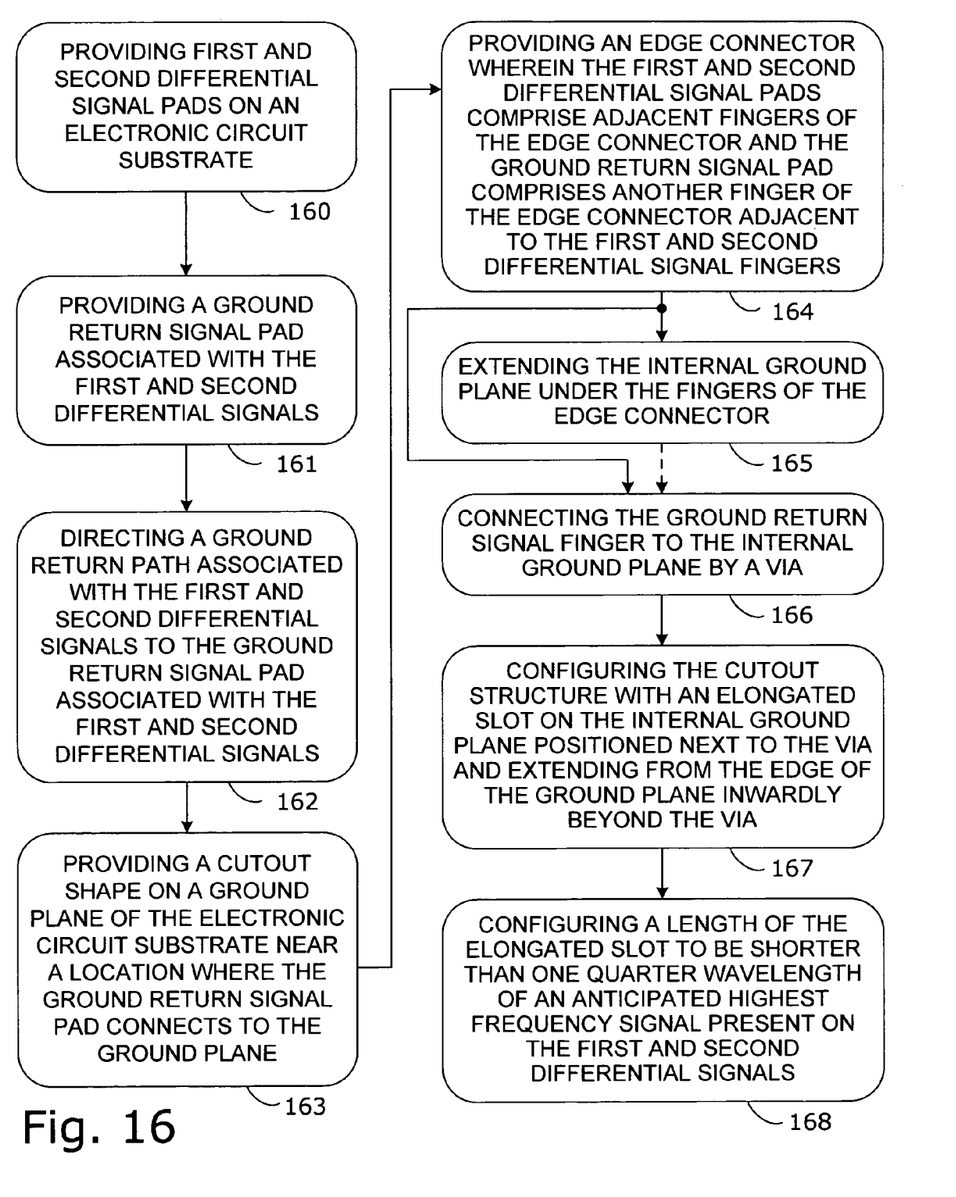
FIG. 16 is a flow diagram illustrating another method in accordance with some embodiments of the invention.

With reference to FIG. 16, some embodiments of the invention may involve providing first and second differential signal pads on an electronic circuit substrate (e.g. at block 160), providing a ground return signal pad associated with the first and second differential signal pads (e.g. at block 161), and directing a ground return path associated with the first and second differential signal pads to the ground return signal pad associated with the first and second differential signal pads (e.g. at block 162).

In some embodiments of the invention, directing the ground return path may involve providing a cutout shape on a ground plane of the electronic circuit substrate near a location where the ground return signal pad connects to the ground plane (e.g. at block 163). Some embodiments may further involve providing an edge connector wherein the first and second differential signal pads comprise adjacent fingers of the edge connector and the ground return signal pad comprises another finger of the edge connector adjacent to the first and second differential signal fingers (e.g. at block 164).

For example, the ground plane may be an internal ground plane and some embodiments may further involve extending the internal ground plane under the fingers of the edge connector (e.g. at block 165). Some embodiments may additionally or alternatively involve connecting the ground return signal finger to the internal ground plane by a via (e.g. at block 166) and configuring the cutout structure with an elongated slot on the internal ground plane positioned next to the via and extending from an edge of the ground plane inwardly beyond the via (e.g. at block 167). For example, some embodiments may further involve configuring a length of the elongated slot to be shorter than one quarter wavelength of a highest relevant frequency signal anticipated to be present on the first and second differential signal fingers (e.g. at block 168).

Figure 17:
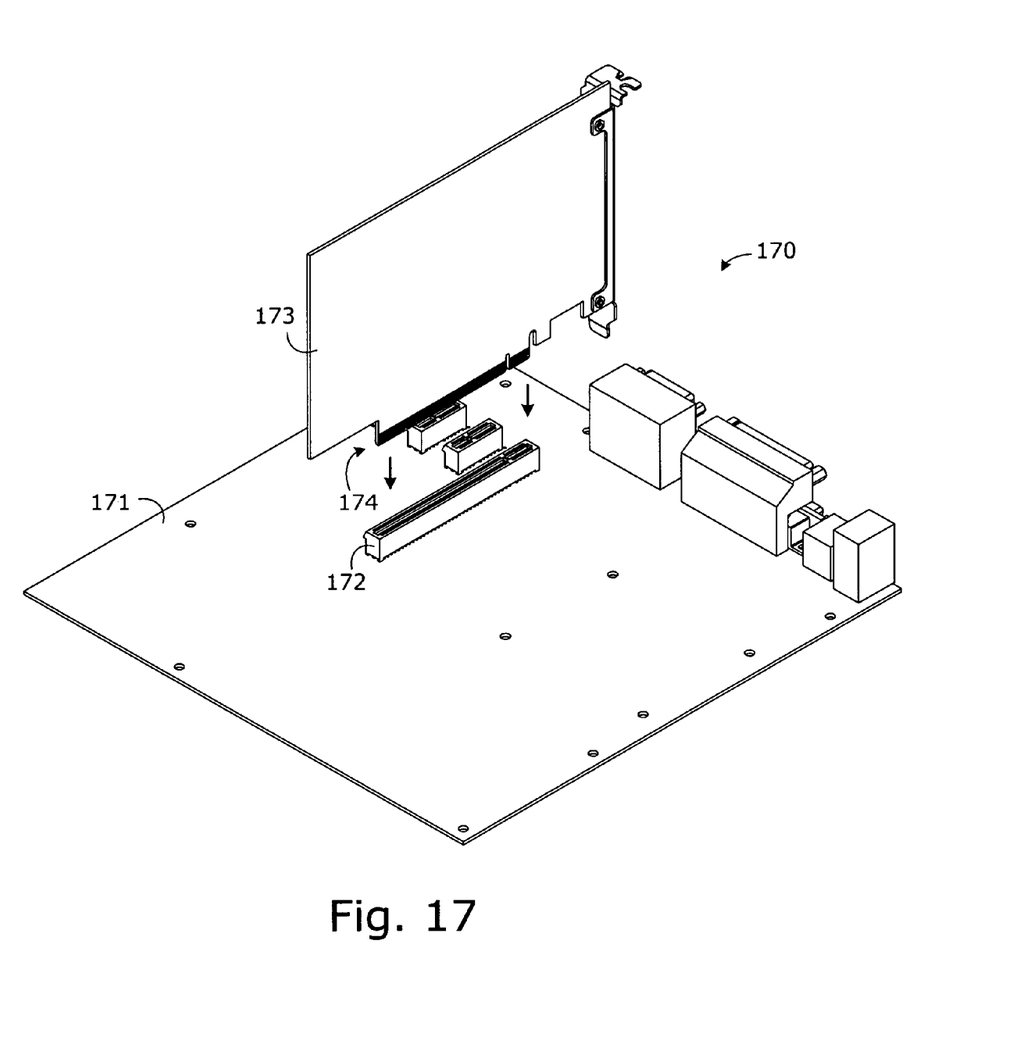
FIG. 17 is a perspective view of another electronic system, in accordance with some embodiments of the invention.

With reference to FIG. 17, an electronic system 170 may include a system board 171, a connector 172 mounted on the system board 171, and an add-in card 173 received in the connector 172. In some embodiments, the add-in card 173 may include an internal ground plane, an edge connector 174 including adjacent first and second differential signal fingers and an adjacent ground return signal finger on the edge connector 174. For example, a via may connect the ground return signal finger to the internal ground plane, and a cutout structure on the internal ground plane may be positioned next to the via, wherein the cutout structure may be configured to direct a ground return path associated with the adjacent first and second differential signal fingers to the adjacent ground return signal finger (e.g. as described above). For example, the system 170 may be a computer system or set top box system.

In some systems 170, the cutout structure may have a shape selected to reduce crosstalk in a frequency of interest. For example, the cutout structure may have an elongated shape having a length selected to be shorter than one quarter wavelength of a highest relevant frequency signal anticipated to be present on the first and second differential signal fingers. In some systems, the internal ground plane may extend under the fingers of the edge connector.

In some systems 170, the cutout structure may include an elongated slot on the internal ground plane positioned next to the via and extending from an edge of the ground plane inwardly beyond the via. For example, a length of the elongated slot may be shorter than one quarter wavelength of a highest relevant frequency signal anticipated to be present on the first and second differential signal fingers.

In some systems 170, the system board 171 may include an internal system board ground plane, first and second differential signal pads, and an associated ground return signal pad connected to the connector 172. For example, the ground return signal pad may be connected to the internal system board ground plane. The system board 171 may further include another cutout structure on the internal system board ground plane positioned near a location where the ground return signal pad connects to the internal system board ground plane, wherein the cutout structure on the internal system board ground plane is configured to direct another ground return path associated with the adjacent first and second differential signal pads to the adjacent ground return signal pad (e.g. as described above in connection with FIG. 2).

For example, the cutout structure on the internal system board ground plane may have a shape selected to reduce crosstalk in a frequency of interest. In some systems the cutout structure on the internal system board ground plane may have an elongated shape having a length selected to be shorter than one quarter wavelength of a highest relevant frequency signal anticipated to be present on the first and second differential signal pads.

In some embodiments, the system board includes an internal system board ground plane, first and second differential signal pads and an associated ground return signal pad connected to the connector, the ground return signal pad being connected to the internal system board ground plane, and another cutout structure on the internal system board ground plane positioned near a location where the ground return signal pad connects to the internal system board ground plane, wherein the cutout structure on the internal system board ground plane is configured to direct another ground return path associated with the adjacent first and second differential signal pads to the adjacent ground return signal pad. In some embodiments, the cutout structure on the internal system board ground plane has a shape selected to reduce crosstalk in a frequency of interest. In some embodiments, the cutout structure on the internal system board ground plane has an elongated shape having a length selected to be shorter than one quarter wavelength of a highest relevant frequency signal anticipated to be present on the first and second differential signal pads.

The foregoing and other aspects of the invention are achieved individually and in combination. The invention should not be construed as requiring two or more of such aspects unless expressly required by a particular claim. Moreover, while the invention has been described in connection with what is presently considered to be the preferred examples, it is to be understood that the invention is not limited to the disclosed examples, but on the contrary, is intended to cover various modifications and equivalent arrangements included within the spirit and the scope of the invention.

What is claimed is:

1. An apparatus, comprising:
   an electronic circuit substrate;
   a ground plane on the electronic circuit substrate;
   first and second differential signal pads on the electronic circuit substrate;
   a ground return signal pad associated with the first and second differential signal pads, the ground return signal pad being connected to the ground plane on the electronic circuit substrate; and
   a cutout structure on the ground plane positioned near a location where the ground return signal pad connects to the ground plane,
   wherein the cutout structure is configured to direct a ground return path associated with the first and second differential signal pads to the ground return signal pad associated with the first and second differential signal pads;
   wherein the cutout structure has an elongated shape having a length selected to be shorter than one quarter wavelength of a highest relevant frequency signal anticipated to be present on the first and second differential signal pads.

2. The apparatus of claim 1, wherein the cutout structure has a shape selected to reduce crosstalk in a frequency of interest.

3. The apparatus of claim 1, wherein the first and second differential signal pads comprise adjacent first and second differential fingers of an edge connector and the ground return signal pad comprises a ground return signal finger of the edge connector adjacent to the first and second differential signal fingers.

4. The apparatus of claim 3, wherein the ground plane comprises an internal ground plane, and the ground return signal finger is connected to the internal ground plane by a via, and wherein the cutout structure comprises an elongated slot on the internal ground plane positioned next to the via and extending from an edge of the internal ground plane inwardly beyond the via.

5. The apparatus of claim 3, wherein the ground plane comprises an internal ground plane which extends under one or more of the fingers of the edge connector.

6. An apparatus, comprising:
   an electronic circuit substrate;
   a ground plane on the electronic circuit substrate;
   first and second differential signal pads on the electronic circuit substrate;
   a ground return signal pad associated with the first and second differential signal pads, the ground return signal pad being connected to the ground plane on the electronic circuit substrate; and
   a cutout structure on the ground plane positioned near a location where the ground return signal pad connects to the ground plane,
   wherein the cutout structure is configured to direct a ground return path associated with the first and second differential signal pads to the ground return signal pad associated with the first and second differential signal pads;
   wherein the first and second differential signal pads comprise adjacent fingers of an edge connector and the ground return signal pad comprises a ground return signal finger of the edge connector adjacent to the first and second differential signal fingers;
   wherein the ground plane comprises an internal ground plane, and the ground return signal finger is connected to the internal ground plane by a via, and wherein the cutout structure comprises an elongated slot on the internal ground plane positioned next to the via and extending from an edge of the internal ground plane inwardly beyond the via; and
   wherein a length of the elongated slot is shorter than one quarter wavelength of a highest relevant frequency signal anticipated to be present on the first and second differential signal fingers.

7. A method, comprising:
   providing first and second differential signal pads on an electronic circuit substrate;
   providing a ground return signal pad associated with the first and second differential signal pads;
   directing a ground return path associated with the first and second differential signal pads to the ground return signal pad associated with the first and second differential signal pads, where directing the ground return path comprises providing a cutout shape on a ground plane of the electronic circuit substrate near a location where the ground return signal pad connects to the ground plane; and
   configuring the cutout structure with an elongated shape having a length selected to be shorter than one quarter wavelength of a highest relevant frequency signal anticipated to be present on the first and second differential signal pads.

8. The method of claim 7, further comprising:
configuring a shape of the cutout structure to reduce crosstalk in a frequency of interest.

9. The method of claim 7, further comprising:
providing an edge connector wherein the first and second differential signal pads comprise adjacent first and second differential signal fingers of the edge connector and the ground return signal pad comprises a ground return signal finger of the edge connector adjacent to the first and second differential signal fingers.

10. The method of claim 9, wherein the ground plane comprises an internal ground plane, the method further comprising:
connecting the ground return signal finger to the internal ground plane by a via; and
configuring the cutout structure with an elongated slot on the internal ground plane positioned next to the via and extending from an edge of the internal ground plane inwardly beyond the via.

11. The method of claim 10, further comprising:
configuring a length of the elongated slot to be shorter than one quarter wavelength of a highest relevant frequency signal anticipated to be present on the first and second differential signal fingers.

12. The method of claim 9, wherein the ground plane comprises an internal ground plane, the method further comprising:
extending the internal ground plane under one or more of the fingers of the edge connector.

13. A system, comprising:
a system board;
a connector mounted on the system board; and
an add-in card received in the connector, the add-in card comprising:
an internal ground plane;
an edge connector including adjacent first and second differential signal fingers and an adjacent ground return signal finger on the edge connector;
a via connecting the ground return signal finger to the internal ground plane; and
a cutout structure on the internal ground plane positioned next to the via,
wherein the cutout structure is configured to direct a ground return path associated with the adjacent first and second differential signal fingers to the adjacent ground return signal finger; and
wherein the cutout structure has an elongated shape having a length selected to be shorter than one quarter wavelength of a highest relevant frequency signal anticipated to be present on the first and second differential signal fingers.

14. The system of claim 13, wherein the cutout structure comprises an elongated slot on the internal ground plane positioned next to the via and extending from an edge of the ground plane inwardly beyond the via.

15. The system of claim 14, wherein a length of the elongated slot is shorter than one quarter wavelength of a highest relevant frequency signal anticipated to be present on the first and second differential signal fingers.

16. The system of claim 13, wherein the internal ground plane extends under one or more of the fingers of the edge connector.

17. The system of claim 13, wherein the cutout structure has a shape selected to reduce crosstalk in a frequency of interest.

* * * * *